(12) United States Patent
Yun et al.

(10) Patent No.: US 12,284,855 B2
(45) Date of Patent: Apr. 22, 2025

(54) MINIATURE LIGHT EMITTING DIODE CHIP, DISPLAY SUBSTRATE AND METHOD FOR MANUFACTURING THE DISPLAY SUBSTRATE, DISPLAY DEVICE

(71) Applicants: BOE MLED TECHNOLOGY CO., LTD., Beijing (CN); BOE TECHNOLOGY GROUP CO., LTD., Beijing (CN)

(72) Inventors: Xaiwei Yun, Beijing (CN); Chenchang Chen, Beijing (CN); Wenchieh Huang, Beijing (CN); Bo Gao, Beijing (CN); Xuehai Qian, Beijing (CN); Meiling Jin, Beijing (CN); Wenjia Sun, Beijing (CN); Xiaozhou Liu, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 428 days.

(21) Appl. No.: 17/449,058

(22) Filed: Sep. 27, 2021

(65) Prior Publication Data
US 2022/0320394 A1 Oct. 6, 2022

(30) Foreign Application Priority Data
Mar. 31, 2021 (CN) .............................. 202110353512

(51) Int. Cl.
*H01L 33/62* (2010.01)
*H01L 25/075* (2006.01)
(Continued)

(52) U.S. Cl.
CPC ....... *H10H 20/857* (2025.01); *H01L 25/0753* (2013.01); *H10H 20/01* (2025.01); *H10H 20/851* (2025.01); *H10H 20/0364* (2025.01)

(58) Field of Classification Search
CPC ......... H01L 25/0753; H01L 2933/0066; H01L 33/005; H01L 33/486; H01L 33/50;
(Continued)

(56) References Cited

U.S. PATENT DOCUMENTS

| 9,905,543 B2 | 2/2018 | Yeon et al. |
| 10,153,260 B2 | 12/2018 | Yeon et al. |

(Continued)

FOREIGN PATENT DOCUMENTS

| CN | 107134469 A | 9/2017 |
| CN | 108206162 A | 6/2018 |

(Continued)

*Primary Examiner* — Bryan R Junge
*Assistant Examiner* — Jeremy Daniel Watts
(74) *Attorney, Agent, or Firm* — Kinney & Lange, P.A.

(57) ABSTRACT

A miniature light emitting diode chip, a display substrate and a manufacturing method thereof, and a display device are provided. The miniature light emitting diode chip includes: a substrate, including a first side and a second side; a first contact portion and a plurality of contact portions; and a plurality of miniature light emitting diodes. The miniature light emitting diodes each include a first electrode and a second electrode. An orthographic projection of a combination of the plurality of miniature light emitting diodes and a spacing between any two of the plurality of miniature light emitting diodes falls within the substrate. The first electrode of each of the plurality of miniature light emitting diodes is electrically connected to the first contact portion, and the second electrode of each of the plurality of miniature light emitting diodes is electrically connected to the plurality of second contact portions, respectively.

13 Claims, 8 Drawing Sheets

(51) Int. Cl.
  *H01L 33/00*   (2010.01)
  *H01L 33/50*   (2010.01)
  *H10H 20/01*   (2025.01)
  *H10H 20/851*  (2025.01)
  *H10H 20/857*  (2025.01)

(58) Field of Classification Search
  CPC ......... H01L 33/62; H01L 22/00; H01L 22/30; H01L 22/14; H01L 21/00; H01L 21/02; H01L 21/68; H01L 21/682; H01L 21/673; H01L 21/77; H01L 2021/775; H01L 23/52; H01L 23/538; H01L 23/5384; H01L 23/5386; H01L 24/94; H01L 24/95; H01L 24/96; H01L 24/97; H01L 24/93; H01L 24/74; H01L 24/01; H01L 24/00; H01L 24/26; H01L 24/27; H01L 24/28; H01L 24/30; H01L 24/29; H01L 25/00; H01L 25/50; H01L 27/00; H01L 33/38; H01L 33/502; H01L 2221/68368; H01L 2223/54426; H01L 2224/05552; H01L 24/32; H01L 24/83; H01L 2924/12041; H01L 2924/12044; H01L 2224/9211; H01L 24/73; H01L 24/92; H01L 27/1259; H01L 33/08; H01L 27/153; H01L 2933/0008; H01L 33/508; H01L 25/13; H01L 27/15; H01L 27/156; H10K 59/127; H10K 59/1275; H10K 59/35; H10K 59/38; H10K 59/00; H10K 59/122; H10K 59/30; H10H 29/8508; H10H 29/857; H10H 29/10–142; H10H 29/20; H10H 29/24

See application file for complete search history.

(56) References Cited

U.S. PATENT DOCUMENTS

| | | | |
|---|---|---|---|
| 10,165,639 | B2 | 12/2018 | Chen et al. |
| 10,497,683 | B2 | 12/2019 | Yeon et al. |
| 10,770,436 | B2 | 9/2020 | Yeon et al. |
| 11,450,651 | B2 | 9/2022 | Shi et al. |
| 11,658,162 | B2 | 5/2023 | Lee et al. |
| 2005/0127389 | A1* | 6/2005 | Fujiwara ............... H01L 27/153 257/99 |
| 2015/0076528 | A1* | 3/2015 | Chan ..................... H01L 24/05 438/34 |
| 2017/0250316 | A1 | 8/2017 | Yeon et al. |
| 2018/0084614 | A1* | 3/2018 | Bower .................... H05K 3/225 |
| 2018/0166425 | A1 | 6/2018 | Yeon et al. |
| 2018/0177011 | A1 | 6/2018 | Chen et al. |
| 2019/0067257 | A1 | 2/2019 | Yeon et al. |
| 2020/0066689 | A1 | 2/2020 | Yeon et al. |
| 2020/0227395 | A1* | 7/2020 | Shi ........................ H01L 25/0753 |
| 2020/0402943 | A1* | 12/2020 | Hien ..................... H01L 25/0753 |
| 2021/0134890 | A1* | 5/2021 | Ichihashi ............. H10K 59/38 |
| 2021/0375833 | A1* | 12/2021 | Lee ....................... H01L 33/0095 |
| 2021/0398865 | A1* | 12/2021 | Lin ........................ H01L 33/62 |
| 2022/0157796 | A1* | 5/2022 | Ishikawa ............... H01L 33/62 |
| 2022/0225508 | A1* | 7/2022 | Cok ....................... H05K 1/167 |
| 2022/0254760 | A1* | 8/2022 | Kundaliya ............ H01L 27/153 |
| 2023/0018253 | A1 | 1/2023 | Shi et al. |
| 2023/0413641 | A1* | 12/2023 | Shiiba ..................... G02F 1/13 |

FOREIGN PATENT DOCUMENTS

| | | |
|---|---|---|
| CN | 109952641 A | 6/2019 |
| CN | 110870066 A | 3/2020 |

\* cited by examiner

MINIATURE LIGHT EMITTING DIODE CHIP, DISPLAY SUBSTRATE AND METHOD FOR MANUFACTURING THE DISPLAY SUBSTRATE, DISPLAY DEVICE

CROSS-REFERENCE TO RELATED APPLICATION

This application claims the benefit of Chinese Patent Application No. 202110353512.6 filed on Mar. 31, 2021 in the State Intellectual Property Office of China, the whole disclosure of which is incorporated herein by reference.

TECHNICAL FIELD

The present disclosure relates to a technical field of miniature light emitting diode, and in particular, to a miniature light emitting diode chip, a display substrate and a method for manufacturing the display substrate, and a display device.

BACKGROUND

Light emitting diode (LED) technology has been developed for nearly thirty years, and its application range has continued to expand. For example, the LED technology can be applied to the display field, and can be used as a backlight source of a display device or be used as an LED display screen. With the development of technology, Mini Light Emitting Diode (Mini LED) display technology and Micro Light Emitting Diode (Micro LED) display technology have gradually become a hot spot in display devices. LED has advantages of self-illumination, wide viewing angle, fast response, simple structure, long life, etc. Moreover, Mini LED/Micro LED display can achieve large-size display by splicing, so they have a good market prospect. At present, structures and manufacturing processes of Mini LED/Micro LED display devices are one of the important topics that R&D personnel pay attention to.

The above information disclosed in this section is only used to understand the background of the inventive concept of the present disclosure, and therefore, the above information may include information that does not constitute the prior art.

SUMMARY

In order to solve at least one aspect of the above-mentioned problems, embodiments of the present disclosure provide a miniature light emitting diode chip, a display substrate and a method for manufacturing the display substrate, a display device.

In one aspect, a miniature light emitting diode chip is provided, including: a substrate, including a first side and a second side that are disposed opposite to each other; a first contact portion and a plurality of second contact portions, arranged on the first side of the substrate; and a plurality of miniature light emitting diodes, arranged on the first side of the substrate, wherein the plurality of miniature light emitting diodes are located on a side of the first contact portion and the second contact portions away from the substrate, and the miniature light emitting diode includes a first electrode and a second electrode, wherein the plurality of miniature light emitting diodes are spaced from each other, and an orthographic projection of a combination of the plurality of miniature light emitting diodes and a spacing between any two of the plurality of miniature light emitting diodes falls within the substrate; and wherein the first electrode of each of the plurality of miniature light emitting diodes is electrically connected to the first contact portion, and the second electrode of each of the plurality of miniature light emitting diodes is electrically connected to the plurality of second contact portions, respectively.

According to some exemplary embodiments, the miniature light emitting diode chip further includes a first terminal and a second terminal that are arranged on the second side of the substrate, the first terminal accesses a first voltage signal, and the second terminal accesses a second voltage signal.

According to some exemplary embodiments, the miniature light emitting diode chip further includes a test terminal arranged on the first side of the substrate, and the test terminal accesses a test signal for implementing a light emitting test.

According to some exemplary embodiments, the miniature light emitting diode chip further includes a third terminal and a fourth terminal that are arranged on the second side of the substrate, the third terminal and the fourth terminal access different electrical signals; and wherein an orthographic projection of at least one of the second terminal and the fourth terminal on the substrate at least partially overlaps with an orthographic projection of the test terminal on the substrate.

According to some exemplary embodiments, colors of light emitted by the plurality of miniature light emitting diodes are different from each other.

According to some exemplary embodiments, colors of light emitted by the plurality of miniature light emitting diodes are the same.

According to some exemplary embodiments, at least one miniature light emitting diode includes a light conversion layer arranged on the first side of the substrate, and the light conversion layer is configured to convert light in a first wavelength range into light in a second wavelength range, wherein the first wavelength range is different from the second wavelength range.

According to some exemplary embodiments, the miniature light emitting diode chip further includes a spacer arranged in the spacing between any two of the plurality of miniature light emitting diodes.

In another aspect, a display substrate is provided, including: a base substrate; and a miniature light emitting diode chip arranged on the base substrate, wherein the miniature light emitting diode chip is the miniature light emitting diode chip described above.

According to some exemplary embodiments, the display substrate further includes a driving circuit arranged on the base substrate, the first terminal, the second terminal and the third terminal of the miniature light emitting diode chip are respectively electrically connected to the driving circuit, the second side of the substrate faces the base substrate, and the first side of the substrate is away from the base substrate.

In another aspect, a display device is provided, including the display substrate described above.

In yet another aspect, a method for manufacturing a display substrate is provided, including: providing a substrate, wherein the substrate includes a first side and a second side that are disposed opposite to each other; forming a first contact portion and a plurality of second contact portions on the first side of the substrate; and transferring a plurality of miniature light emitting diodes to the substrate through a first transfer process, so that the plurality of miniature light emitting diodes are located on a side of the first contact portion and the second contact portions away from the substrate, wherein the miniature light emitting diode includes a first electrode and a second electrode, wherein the plurality of miniature light emitting diodes are spaced from each other, and an orthographic projection of a combination of the plurality of miniature light emitting diodes and a spacing between any two of the plurality of miniature light emitting diodes falls within the substrate; and the first electrode of each of the plurality of miniature light emitting diode is electrically connected to the first contact portion, and the second electrode of each of the plurality of miniature light emitting diodes is electrically connected to the plurality of second contact portions, respectively.

According to some exemplary embodiments, the method further includes: transferring a miniature light emitting diode chip carrying the plurality of miniature light emitting diodes to a base substrate through a second transfer process, wherein an accuracy of the second transfer process is less than an accuracy of the first transfer process.

According to some exemplary embodiments, the method further includes: accessing a test signal to perform a light emitting test on the miniature light emitting diode chip carrying the plurality of miniature light emitting diodes.

BRIEF DESCRIPTION OF THE DRAWINGS

Through the description below to the present disclosure with reference to the drawings, other purposes and advantages of the present disclosure will become apparent, which can facilitate a comprehensive understanding of the present disclosure.

It should be noted that, for clarity, in the drawings used to describe the embodiments of the present disclosure, sizes of layers, structures, or regions may be enlarged or reduced, that is, these drawings are not drawn according to actual scale.

DETAILED DESCRIPTION OF EMBODIMENTS

In the following description, for purpose of explanation, many specific details are set forth to provide a comprehensive understanding of various exemplary embodiments. However, it may be understood that various exemplary embodiments can be implemented without these specific details or one or more equivalent arrangements. In other cases, well-known structures and devices are shown in block diagram forms to avoid unnecessarily obscuring the various exemplary embodiments. In addition, the various exemplary embodiments can be different, but need not be exclusive. For example, without departing from the inventive concept, specific shapes, configurations, and characteristics of an exemplary embodiment can be used or implemented in another exemplary embodiment.

In the drawings, sizes and relative sizes of elements can be enlarged for clarity and/or description purposes. As such, the size and relative size of each element need not be limited to the size and relative size shown in the drawings. When the exemplary embodiments can be implemented differently, a specific process sequence can be performed differently from the described sequence. For example, two consecutively described processes can be performed substantially simultaneously, or in an order opposite to the described order. In addition, the same reference numerals denote the same elements.

When an element is described as being "on", "connected to" or "coupled to" another element, the element can be directly on the other element, directly connected to the other element or directly combined to the other element, or there may be an intermediate element. However, when an element is described as being "directly on", "directly connected to" or "directly coupled to" another element, there is no intermediate element. Other terms and/or expressions used to describe a relationship between elements should be interpreted in a similar manner, for example, "between" and "directly between", "adjacent" and "directly adjacent", or "on" and "directly on" etc. In addition, the term "connected" may refer to a physical connection, an electrical connection, a communication connection, and/or a fluid connection. In addition, the X axis, the Y axis, and the Z axis are not limited to the three axes of the Cartesian coordinate system, and may be interpreted in a broader meaning. For example, the X axis, the Y axis, and the Z axis may be perpendicular to each other, or may represent different directions that are not perpendicular to each other. For the purpose of the present disclosure, "at least one of X, Y, and Z" and "at least one selected from the group consisting of X, Y, and Z" may be interpreted as only X, only Y, only Z, or any combination of two or more of X, Y, and Z such as XYZ, XYY, YZ, and ZZ. As used herein, the term "and/or" includes any and all combinations of one or more of the listed related items.

It should be understood that, although the terms first, second, etc. may be used herein to describe various elements, these elements should not be limited by these terms. These terms are only used to distinguish one element from another. For example, without departing from the scope of the exemplary embodiments, the first element may be named as the second element, and similarly, the second element may be named as the first element.

Herein, an inorganic light emitting diode refer to a light emitting element made of an inorganic material, among which, LED represents an inorganic light emitting element that is different from an OLED. Specifically, the inorganic light emitting element may include a mini light emitting diode (Mini LED) and a micro light emitting diode (Micro LED). Among them, the micro light emitting diode (Micro LED) refers to an ultra-small light emitting diode with a crystal grain size of less than 100 microns, and the mini light emitting diode (Mini LED) refers to a small-sized light emitting diode with a crystal grain size between a Micro LED and a traditional LED. For example, the crystal grain size of the Mini LED may be between 100 and 300 microns, and the crystal grain size of the Micro LED may be between 10 and 100 microns.

Herein, the expression "miniature light emitting diode" includes light emitting diodes with a size less than 300 microns, which includes the aforementioned mini light emitting diode (Mini LED) and the micro-light emitting diode (Micro LED).

Herein, the expression "terminal" refers to a part of a chip that is electrically connected to external leads, wires, electrodes, etc., including but not limited to a pad of the chip.

Herein, unless otherwise specified, the expressions "miniature chip", "microchip", etc. refer to relatively small-sized chips, for example, unpackaged micron-level chips.

Herein, unless otherwise specified, the expression "regular shape" refers to regular figures, including but not limited to rectangles, rounded rectangles, rhombuses, squares, hexagons, octagons, circles, ellipses, rectangles, triangles etc.

Some exemplary embodiments of the present disclosure provide a miniature light emitting diode chip, a display substrate and a method for manufacturing the display substrate, and a display device. For example, some embodiments of the present disclosure provide a miniature light emitting diode chip, including: a substrate, including a first side and a second side disposed oppositely; a first contact portion and a plurality of second contact portions disposed on a first side of the substrate; and a plurality of miniature light emitting diodes arranged on the first side of the substrate, the plurality of miniature light emitting diodes are located on a side of the first contact portion and the second contact portion away from the substrate, the miniature light emitting diode includes a first electrode and a second electrode. The plurality of miniature light emitting diodes are spaced from each other, and an orthographic projection of a combination of the plurality of miniature light emitting diodes and a spacing between any two of the plurality of miniature light emitting diodes on the substrate falls within the substrate; and first electrodes of the plurality of miniature light emitting diodes are all electrically connected to the first contact portion, and second electrodes of the plurality of miniature light emitting diodes are electrically connected to the plurality of second contact portions, respectively.

Figure 1:
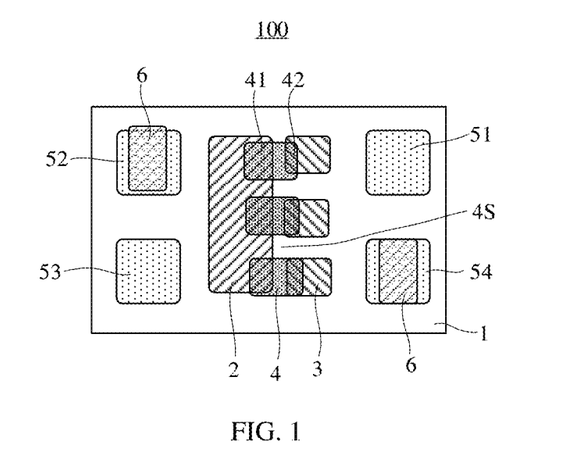
FIG. 1 is a schematic plan view of a miniature light emitting diode chip according to some exemplary embodiments of the present disclosure.
Figure 2:
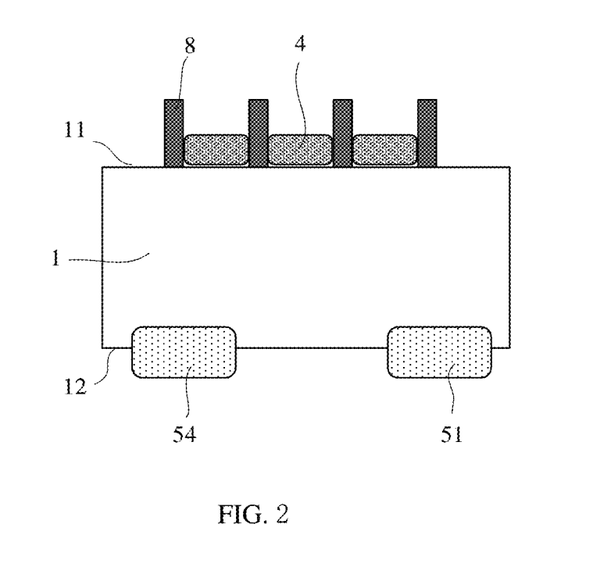
FIG. 2 is a schematic cross-sectional view of a miniature light emitting diode chip according to some exemplary embodiments of the present disclosure.

FIG. 1 is a schematic plan view of a miniature light emitting diode chip according to some exemplary embodiments of the present disclosure, and FIG. 2 is a schematic cross-sectional view of a miniature light emitting diode chip according to some exemplary embodiments of the present disclosure. Referring to FIGS. 1 and 2 in combination, a miniature light emitting diode chip 100 may include: a substrate 1, the substrate 1 includes a first side 11 and a second side 12 disposed oppositely; a first contact portion 2 and a plurality of second contact portions 3 on the first side 11 of the substrate; and a plurality of miniature light emitting diodes 4 arranged on the first side 11 of the substrate, and the plurality of miniature light emitting diodes 4 are located on a side of the first contact portion 2 and the second contact portion 3 away from the substrate, and the miniature light emitting diode 4 includes a first electrode 41 and a second electrode 42. In the embodiments of the present disclosure, by integrating a plurality of miniature light emitting diodes with a Mini IC, it is beneficial to solve difficulties of mass transfer and EL test (electroluminescent test) in Micro LEDs.

As shown in FIGS. 1 and 2, the plurality of miniature light emitting diodes 4 are spaced from each other, and the orthographic projection of the combination of the plurality of miniature light emitting diodes 4 and the spacing 4S between any two of the plurality of miniature light emitting diodes falls within the substrate. In this way, the miniature light emitting diode 4 may be a Micro LED, and a size level of the substrate 1 may be the same as a size level of a mini LED. For example, the substrate 1 may be a mini IC substrate, so that a chip transfer process of Mini LEDs may be used to achieve the transfer of the Micro LED.

It should be noted that herein, the expression "mini IC" refers to a chip equivalent to a size of a mini LED. For example, the size of the substrate of the chip is between 100 and 300 microns.

In the embodiment of the present disclosure, first electrodes 41 of the plurality of miniature light emitting diodes 4 are all electrically connected to the first contact portion 2, and second electrodes 42 of the plurality of miniature light emitting diodes 4 are respectively electrically connected to the plurality of second contact portions 3.

For example, the first electrode 41 may be an anode, and the second electrode 42 may be a cathode, that is, the plurality of miniature light emitting diodes 4 may share an anode pad. Optionally, the embodiments of the present disclosure are not limited thereto. In other embodiments, the first electrode 41 may be a cathode, and the second electrode 42 may be an anode, that is, the plurality of miniature light emitting diodes 4 may share a cathode pad.

Figure 7A:
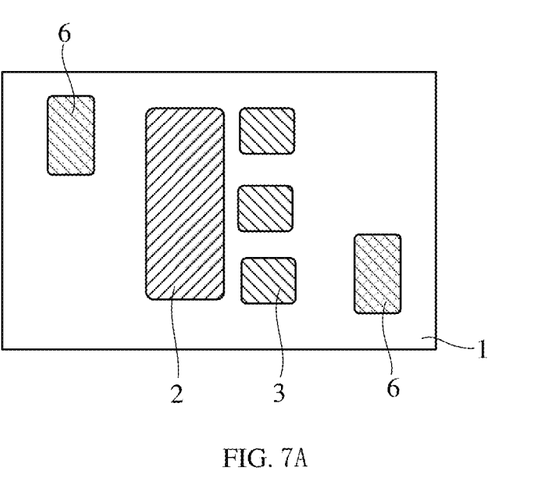
FIG. 7A, FIG. 7B, FIG. 8, FIG. 9 and FIG. 10 are schematic diagrams of structures formed after main steps of a method for manufacturing a display substrate according to some exemplary embodiments of the present disclosure are performed, respectively.
Figure 7B:
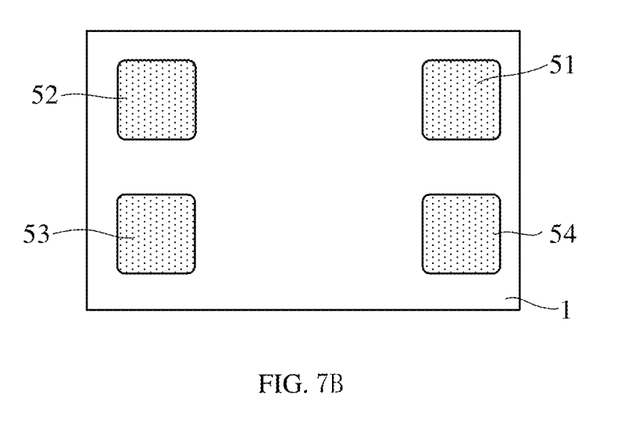

FIGS. 7A and 7B are plan views of a first side and a second side of a mini IC included in a miniature light emitting diode chip according to the embodiments of the present disclosure, respectively. Referring to FIGS. 1, 2, 7A, and 7B in combination, the miniature light emitting diode chip 100 further includes a first terminal 51 and a second terminal 52 arranged on the second side 12 of the substrate, the first terminal 51 accesses a first voltage signal, and the second terminal 52 accesses a second voltage signal. For example, the first terminal 51 may be connected to a VCC or VDD voltage signal, and the second terminal 52 may be connected to a VSS voltage signal.

The miniature light emitting diode chip 100 further includes a test terminal 6 arranged on the first side 11 of the substrate, and the test terminal 6 accesses a test signal for implementing a light emitting test. For example, the number of the test terminals 6 may be two.

For example, the miniature light emitting diode chip 100 further includes a third terminal 53 and a fourth terminal 54 arranged on the second side 12 of the substrate, and the third terminal 53 and the fourth terminal 54 access different electrical signals, respectively. For example, the third terminal 53 may access a data signal, and the fourth terminal 54 may access a test signal.

For example, an orthographic projection of at least one of the second terminal 52 and the fourth terminal 54 on the substrate 1 at least partially overlaps with an orthographic projection of the test terminal 6 on the substrate 1.

In some embodiments, colors of light emitted by the plurality of miniature light emitting diodes 4 are different from each other. For example, the miniature light emitting diode chip 100 may include three miniature light emitting diodes 4, and the three miniature light emitting diodes 4 respectively emit red light, green light and blue light.

Figure 3:
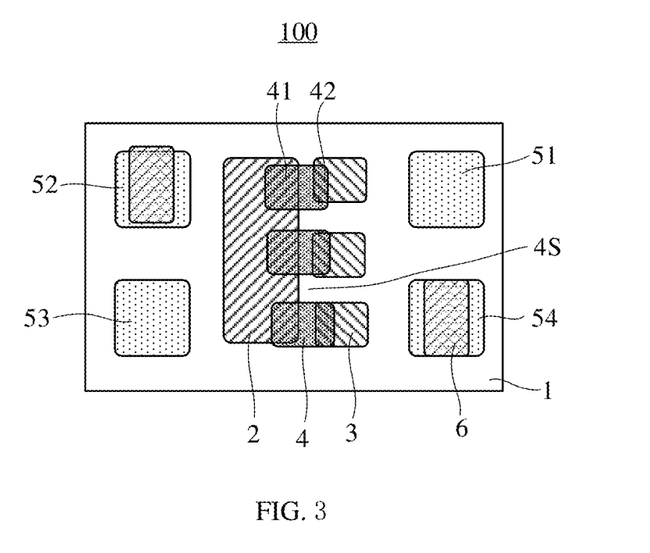
FIG. 3 is a schematic plan view of a miniature light emitting diode chip according to some exemplary embodiments of the present disclosure.
Figure 4:
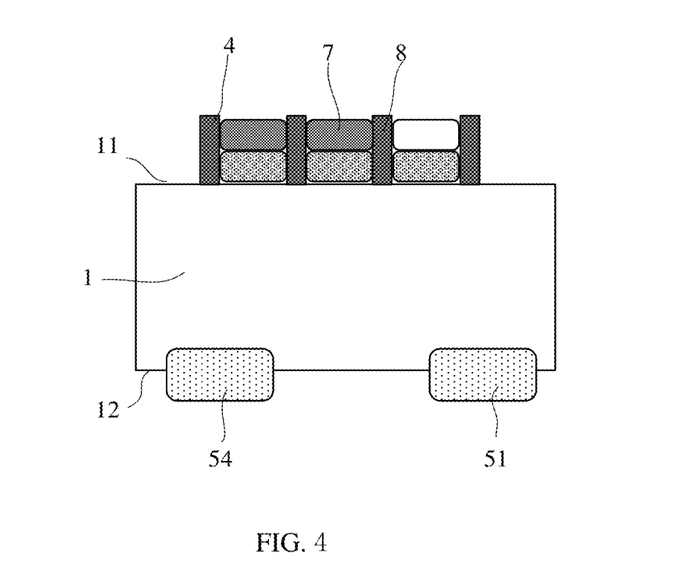
FIG. 4 is a schematic cross-sectional view of a miniature light emitting diode chip according to some exemplary embodiments of the present disclosure.

FIG. 3 is a schematic plan view of a miniature light emitting diode chip according to some exemplary embodiments of the present disclosure, and FIG. 4 is a schematic cross-sectional view of a miniature light emitting diode chip according to some exemplary embodiments of the present disclosure. In the following, differences between the embodiment shown in FIGS. 3 and 4 relative to the above description will be mainly described. For other structures, reference may be made to the above description.

Referring to FIGS. 3 and 4 in combination, at least one miniature light emitting diode 4 may include a light conversion layer 7 arranged on the first side 11 of the substrate for converting light in a first wavelength range into light in a second wavelength range. The first wavelength range is different from the second wavelength range.

For example, the light conversion layer 7 may include quantum dots (QD). In the illustrated embodiment, the light conversion layer 7 may be arranged on a side of the miniature light emitting diode 4 away from the substrate 1.

In some embodiments of the present disclosure, the light conversion layer 7 may include an optical adhesive and fluorescent particles (for example, phosphors or quantum dots). The phosphor may be a combination of a red phosphor, a green phosphor and a blue phosphor, or a combination of the red phosphor and the green phosphor; or a yellow phosphor. For example, a material of the phosphor may include aluminate series phosphors, silicate series phosphors, fluoride series phosphors or oxynitride series phosphors. For example, the quantum dots may include red light quantum dots that emit red light after being excited by blue light and/or green light quantum dots that emit green light after being excited by blue light. The phosphors and/or quantum dots may be doped (for example, uniformly distributed) in the optical adhesive to form the light conversion layer 7.

For example, the miniature light emitting diode 4 may be a miniature light emitting diode that emits blue light, and the light conversion layer 7 may include an optical adhesive, a red light quantum dot that emit red light after being excited by blue light, and a green light quantum dot that emit green light after being excited by blue light.

A light efficiency of different colors of miniature light emitting diodes manufactured by existing processes of growing miniature light emitting diodes is different. The light efficiency of the blue miniature light emitting diode may reach 40%, the light efficiency of the green miniature light emitting diode may reach 20-30%, and the light efficiency of the red miniature light emitting diode is only 10%. In this way, in a display panel using a three-color (R/G/B) miniature light emitting diode, there may be problems of low light efficiency and uneven light emission. In a display panel according to the embodiments of the present disclosure, a structure of a monochromatic (for example, blue) miniature light emitting diode+quantum dots is adopted, which may make full use of the advantages of high light efficiency of the blue miniature light emitting diode, and improve an overall light efficiency of the light emitting diode chip.

In addition, in the embodiments of the present disclosure, particle sizes of the quantum dots may be adjusted so that the light conversion layer 7 may emit light of other colors. For example, the light conversion layer 7 may emit yellow light (Y) by adjusting the particle sizes of the quantum dots. In this way, by adjusting the particle sizes of the quantum dots, a plurality of colors (such as R/G/B/Y) may be achieved, to achieve a plurality of color combinations such as RGB/RGBY, thereby increasing a display color gamut.

For example, the colors of the light emitted by the plurality of miniature light emitting diodes 4 are the same, for example, all of them are blue.

Referring to FIGS. 1 to 4, the miniature light emitting diode chip 100 further includes a spacer 8 which is arranged in the spacing 4S between any two of the plurality of miniature light emitting diodes 4.

Figure 5A:
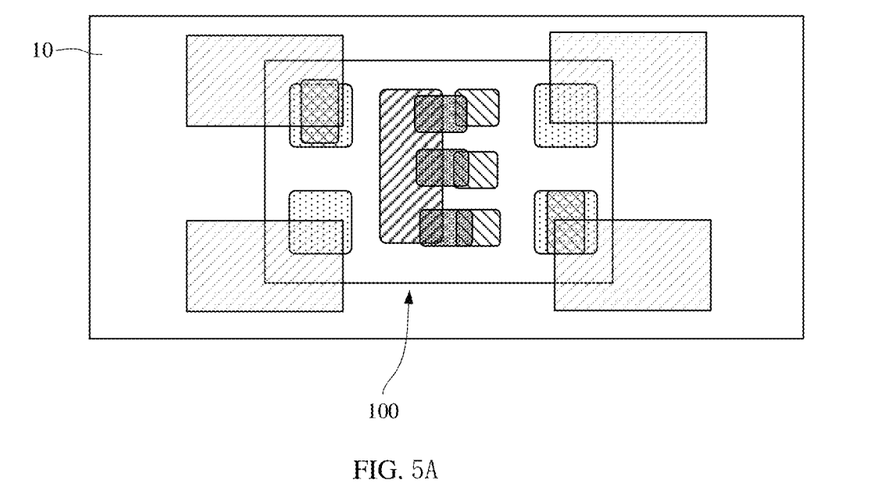
FIG. 5A is a schematic top view of a display substrate according to some exemplary embodiments of the present disclosure.
Figure 5B:
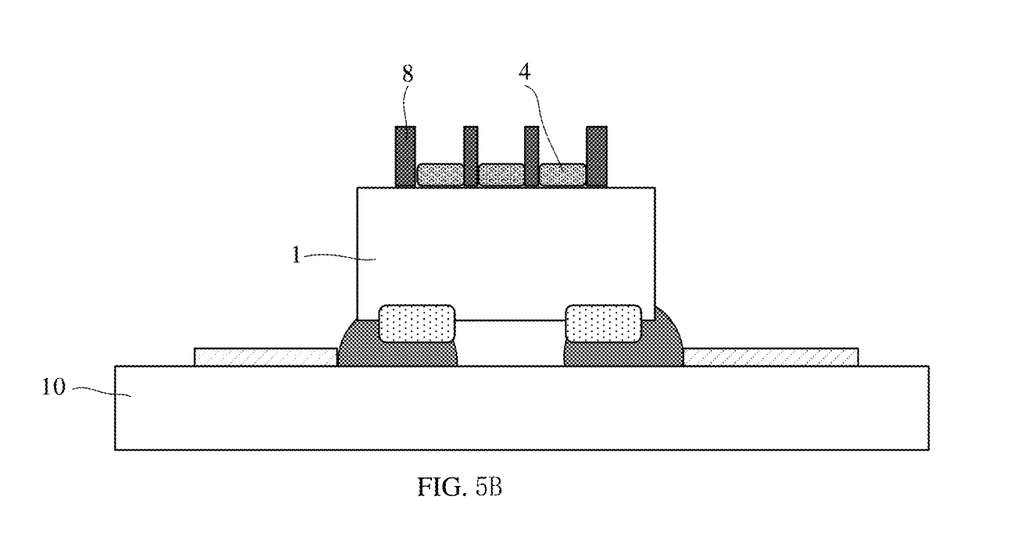
FIG. 5B is a schematic cross-sectional view of a display substrate according to some exemplary embodiments of the present disclosure.

FIG. 5A is a schematic top view of a display substrate according to some exemplary embodiments of the present disclosure, and FIG. 5B is a schematic cross-sectional view of a display substrate according to some exemplary embodiments of the present disclosure, respectively. Referring to FIGS. 1 to 5B in combination, the display substrate may include: a base substrate 10; and a miniature light emitting diode chip 100 arranged on the base substrate 10.

For example, a second side 12 of the substrate faces the base substrate 10 and a first side 11 of the substrate is away from the base substrate 10.

For example, the display substrate may further include a driving circuit 200 arranged on the base substrate 10, and a first terminal 51, a second terminal 52, and a third terminal 53 of a miniature light emitting diode chip are respectively electrically connected to the driving circuit 200.

Figure 11:
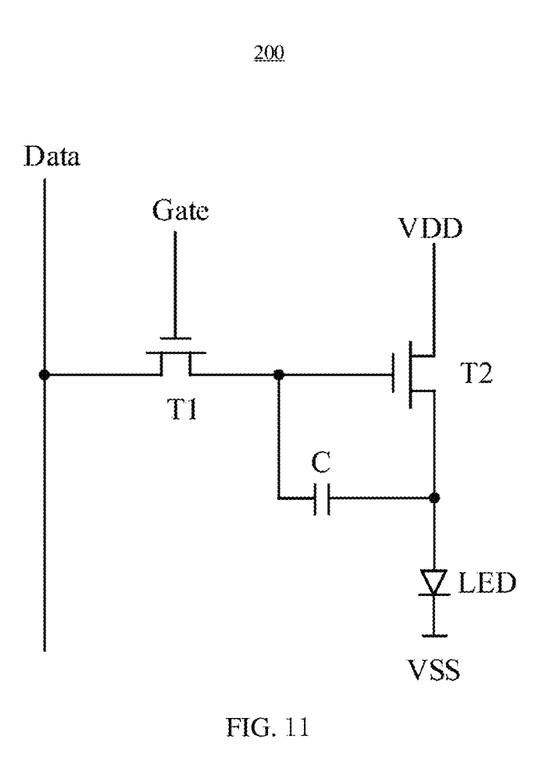
FIG. 11 is a schematic diagram of a driving circuit according to some exemplary embodiments of the present disclosure.

FIG. 11 is a schematic diagram of a driving circuit 200 according to some exemplary embodiments of the present disclosure. For example, as shown in FIG. 11, the driving circuit 200 may include a first transistor T1, a second transistor T2, and a capacitor C, a first terminal of the first transistor is connected to a source driving signal (i.e., a data signal) terminal Data, a control terminal of the first transistor is connected to a gate driving signal terminal Gate, and a second terminal of the first transistor is connected to a control terminal of the second transistor T2; a first terminal of the second transistor T2 is connected to a first power signal (i.e., the first voltage signal) terminal VDD, a second terminal of the second transistor is connected to a light emitting diode LED, and the capacitor C is connected between the second terminal of the first transistor and the second terminal of the second transistor.

Figure 6:
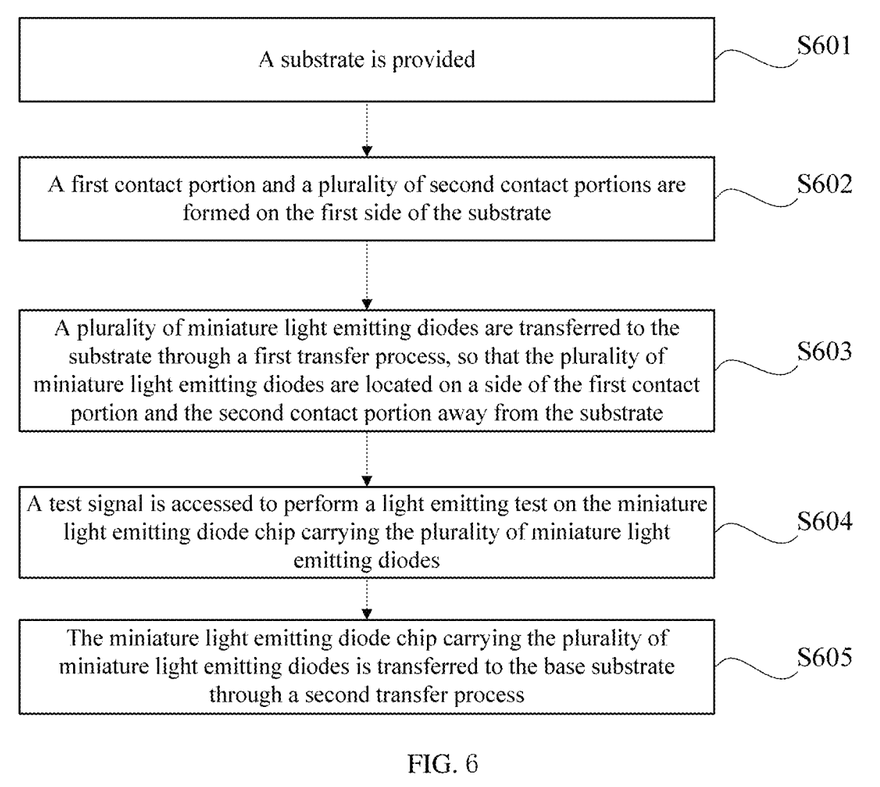
FIG. 6 is a flowchart of a method for manufacturing a display substrate according to some exemplary embodiments of the present disclosure.

FIG. 6 is a flowchart of a method for manufacturing a display substrate according to some exemplary embodiments of the present disclosure. FIG. 7A, FIG. 7B, FIG. 8, FIG. 9, and FIG. 10 are schematic diagrams of structures formed after main steps of a method for manufacturing a display substrate according to some exemplary embodiments of the present disclosure are performed, respectively.

In step S601, a substrate is provided, and the substrate includes a first side and a second side that are opposed to each other.

In step S602, a first contact portion and a plurality of second contact portions are formed on the first side of the substrate.

In step S603, a plurality of miniature light emitting diodes are transferred to the substrate through a first transfer process, so that the plurality of miniature light emitting diodes are located on a side of the first contact portion and the second contact portion away from the substrate. The miniature light emitting diode includes a first electrode and a second electrode.

For example, the plurality of miniature light emitting diodes are spaced from each other, and an orthographic projection of a combination of the plurality of miniature light emitting diodes and a spacing between any two of the plurality of miniature light emitting diodes on the substrate falls within the substrate; and the first electrodes of the plurality of miniature light emitting diodes are all electrically connected to the first contact portion, and the second electrodes of the plurality of miniature light emitting diodes are electrically connected to the plurality of second contact portions, respectively.

For example, the first transfer process may be a wafer-level transfer process, and the first transfer process involves transfer on a silicon substrate. The transfer process on the silicon base is relatively mature. Compared with directly transferring the miniature light emitting diode to a glass substrate, the transfer process on the silicon base may reduce a process difficulty.

In some embodiments, the method for manufacturing further includes step S604 and step S605. For example, in step S604, a test signal is accessed to perform a light emission test on the miniature light emitting diode chip carrying the plurality of miniature light emitting diodes. In step S605, the miniature light emitting diode chip carrying the plurality of miniature light emitting diodes is transferred to the base substrate through a second transfer process, and an accuracy of the second transfer process is less than an accuracy of the first transfer process.

In the embodiments of the present disclosure, the plurality of miniature light emitting diodes are integrated on a mini IC, and a size of the mini IC is larger than a size of a single miniature light emitting diode, which may further reduce the difficulty of transferring the mini IC to the glass substrate.

For example, in step S602, referring to FIGS. 7A and 7B, the first contact portion 2, the plurality of second contact portions 3, and the test terminals 6 may be formed on the first side 11 of the substrate 1; and the first terminal 51, the second terminal 52, the third terminal 53 and the fourth terminal 54 are formed on the second side 12. For example, the Pad (the first contact portion 2, the plurality of second contact portions 3, and the test terminals 6) on the first side 11 may be accessed to the second side 12 through TSV (i.e., through silicon via) technology to facilitate an electrical connection between the Mini IC and the driving circuit on the backplane.

Figure 8:
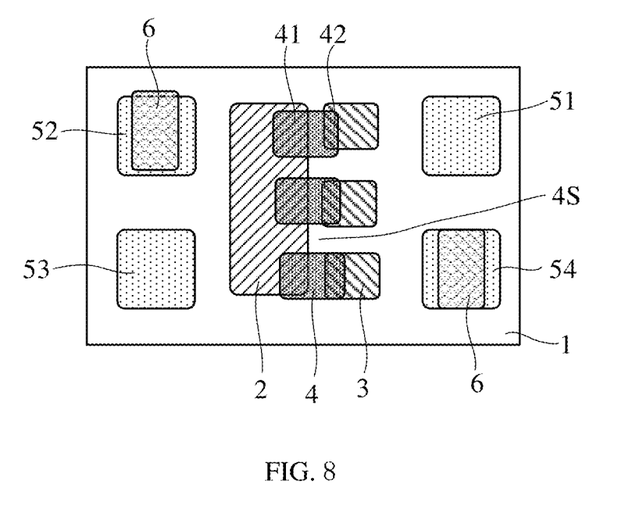

For example, in step S603, referring to FIG. 8, a wafer-level mass transfer process (that is, the first transfer process) may be used to perform mass transfer of the miniature light emitting diodes, and the plurality of miniature light emitting diodes 4 are bonded on a front surface (i.e., the first side 11) of the Mini IC, so that the substrate 1 carrying the plurality of miniature light emitting diodes 4 is obtained.

Figure 9:
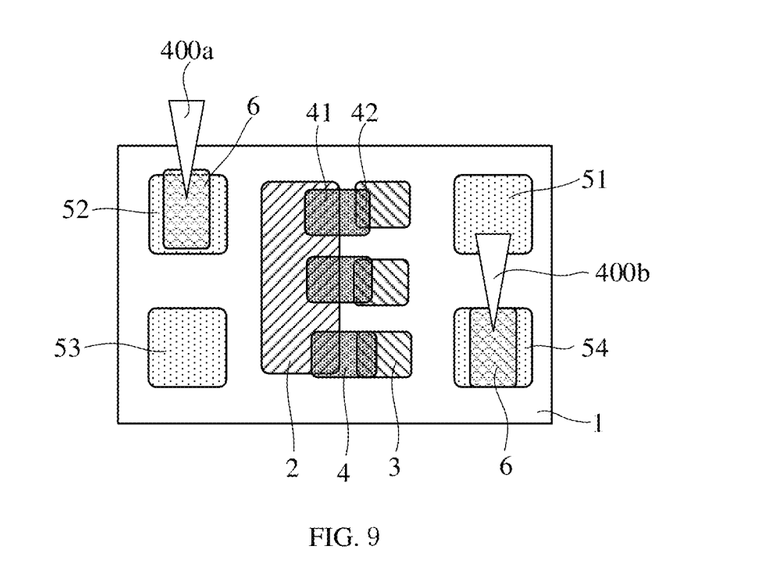

For example, in step S604, the Mini IC and the plurality of miniature light emitting diodes 4 may be detected at the same time, and EL detection of the Mini IC and the plurality of miniature light emitting diodes 4 may be achieved. Referring to FIG. 9, two probes 400a and 400b are used to contact the two test terminals 6, respectively. Although the present embodiment uses the two probes to contact the two test terminals 6, respectively, the embodiments of the present disclosure are not limited to this. In other embodiments, the number of probes may be changed with the number of the test terminals 6. For example, more than 3 test terminals 6 may be tested simultaneously by using more than 3 probes. The probes 400a and 400b respectively apply voltages to the miniature light emitting diode 4 to detect whether the miniature light emitting diode 4 normally emits light. In this way, the EL test (i.e., the light emitting test) for the light emitting diodes may be achieved.

Figure 10:
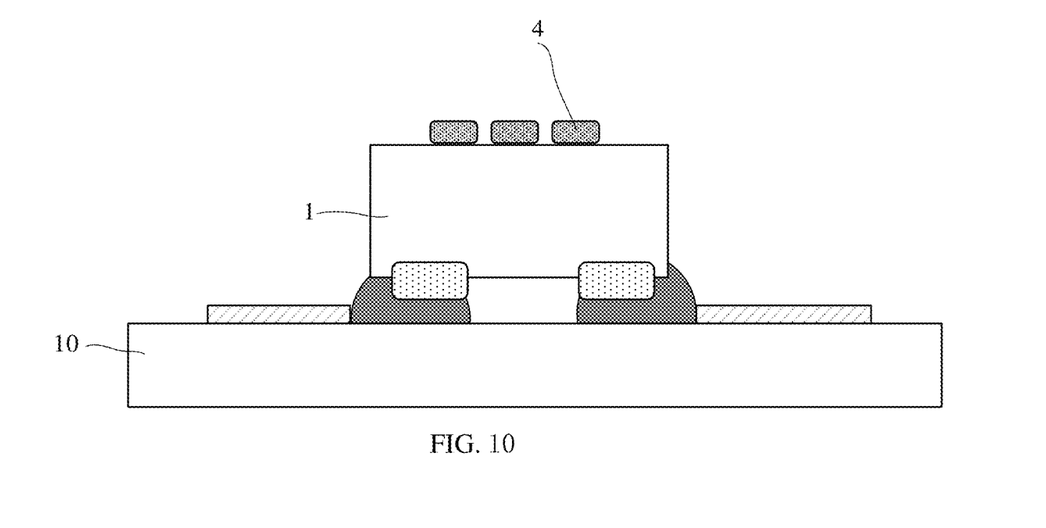

For example, in step S605, the Mini LED chip acupuncture or P&P bonding technology may be used to place the Mini IC chip carrying the plurality of miniature light emitting diodes on the blue film, and the Mini LED chip transfer process (i.e., the second transfer process) may be used to transfer the Mini IC chip carrying the plurality of miniature light emitting diodes to the base substrate to achieve full color. For example, the accuracy of the second transfer process is less than the accuracy of the first transfer process.

In the embodiments of the present disclosure, the method for transferring Mini elements is used to achieve the mass transfer of Micro-level, which simplifies the mass transfer process of Micro LED, and is suitable for the current existing production lines.

For example, the mass transfer process may be based on technologies such as Fine Pick/Place, Selective Release, Self-Assembly, and Roll Printing. For another example, electrostatic force, Van der Waals force or magnetic force may be used in the Fine Pick/Place technology to accurately grasp and place miniature light emitting diodes.

For example, the method for manufacturing may also include manufacturing a spacer to prevent the RGB colors from crossing and reduce the color gamut of a product. For example, after the light conversion layer 7 is completed, a dense layer of silicon nitride may be encapsulated on the surface as a water and oxygen barrier layer, to isolate an influence of moisture and oxygen on the quantum dots. Finally, the blue light emitted by the surface light source is converted into red light and green light after passing through the red quantum dot material and the green quantum dot material respectively, the red light and the green light form the RGB three-color full color display together with the blue light which remains unchanged from the blue chip through the scatter particles.

It should be noted that some steps of the above method may be performed individually or in combination, and may be performed in parallel or sequentially, and are not limited to the specific operation sequence shown in the drawing.

Figure 12:
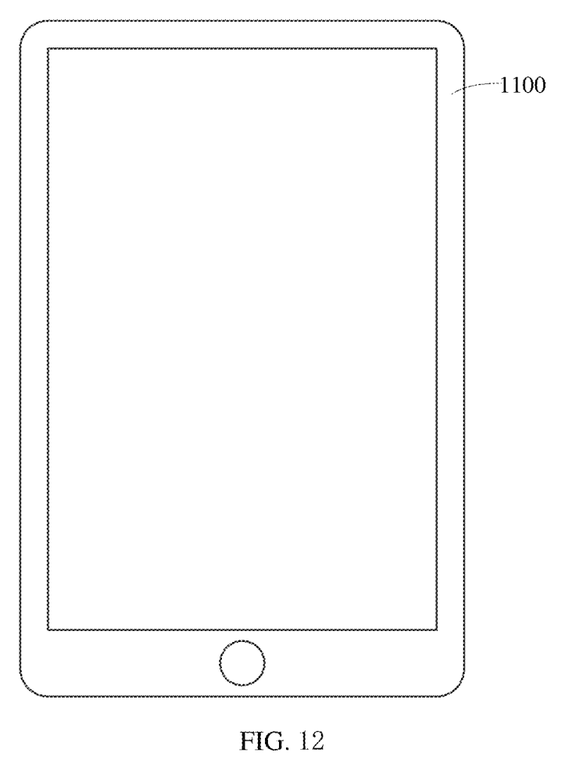
FIG. 12 is a schematic diagram of a display device according to some exemplary embodiments of the present disclosure.

In addition, the embodiments of the present disclosure also provide a display device, including the display panel provided in the above-mentioned embodiments. As shown in FIG. 12, which shows a plan view of a display device according to the embodiments of the present disclosure, the display device 1100 may include the display panel described in any one of the above. For example, the display device may be any product or component with a display function, such as a smart phone, a wearable smart watch, smart glasses, a tablet computer, a television, a display, a laptop computer, a digital photo frame, a navigator, a vehicle monitor, an e-book, etc.

It should be understood that the embodiments of the present disclosure provide a miniature light emitting diode chip, a display substrate and a method for manufacturing the display substrate, and a display device, which may achieve at least one of the following effects:
(1) Conducive to reducing the difficulty of massive transfer;
(2) EL detection may be carried out for the entire element, and the miniature light emitting diode and the driving chip may be sorted at the same time;
(3) It is possible to control the pitch between the miniature light emitting diode chips, which is beneficial to improve PPI;
(4) Auxiliary secondary optical design may be carried out, which is conducive to the achievement of full color.

As used herein, the terms "substantially", "approximately", "about" and other similar terms are used as approximate terms rather than as terms of degree, and they are intended to explain the inherent deviations of measured or calculated values that will be recognized by those of ordinary skill in the art. Taking into account factors such as process fluctuations, measurement problems, and errors related to the measurement of specific quantities (i.e., the limitations of the measurement system), "approximately" or "about" as used herein includes a stated value and means that the specific value determined by a person of ordinary skill in the art is within an acceptable deviation range. For example, "about" may mean within one or more standard deviations, or within ±10% or ±5% of the stated value.

Although some embodiments according to the general inventive concept of the present disclosure have been illustrated and described, those of ordinary skill in the art will understand that changes may be made to these embodiments without departing from the principles and spirit of the general inventive concept of the present disclosure. And the scope of the present disclosure is defined by the claims and their equivalents.

What is claimed is:

1. A miniature light emitting diode chip, comprising:
a substrate, comprising a first side and a second side that are disposed opposite to each other;
a first contact portion and a plurality of second contact portions, arranged on the first side of the substrate; and
a plurality of miniature light emitting diodes, arranged on the first side of the substrate, wherein the plurality of miniature light emitting diodes are located on a side of the first contact portion and the second contact portions away from the substrate, and the miniature light emitting diodes each comprise a first electrode and a second electrode,
wherein the plurality of miniature light emitting diodes are spaced from each other, and an orthographic projection of a combination of the plurality of miniature light emitting diodes and a spacing between any two of the plurality of miniature light emitting diodes falls within the substrate;
wherein the first electrode of each of the plurality of miniature light emitting diodes is electrically connected to the first contact portion, and the second electrode of each of the plurality of miniature light emitting diodes is electrically connected to the plurality of second contact portions, respectively; and
wherein the miniature light emitting diode chip further comprises:
a first terminal and a second terminal that are arranged on the second side of the substrate, and wherein the first terminal accesses a first voltage signal and the second terminal accesses a second voltage signal,
a third terminal and a fourth terminal that are arranged on the second side of the substrate, wherein the third terminal and the fourth terminal access different electrical signals; and
a test terminal arranged on the first side of the substrate, wherein the test terminal accesses a test signal for implementing a light emitting test;
wherein an orthographic projection of at least one of the second terminal or the fourth terminal on the substrate at least partially overlaps with an orthographic projection of the test terminal on the substrate;
wherein an orthographic projection of the first contact portion on the substrate is spaced apart from an orthographic projection of each of the first terminal, the second terminal, the third terminal and the fourth terminal on the substrate, and an orthographic projection of the second contact portion on the substrate is spaced apart from an orthographic projection of each of the first terminal, the second terminal, the third terminal and the fourth terminal on the substrate; and
wherein the orthographic projection of each of the first contact portion and the second contact portion on the substrate is spaced apart from an orthographic projection of the test terminal on the substrate.

2. The miniature light emitting diode chip according to claim 1, wherein colors of light emitted by the plurality of miniature light emitting diodes are different from each other.

3. The miniature light emitting diode chip according to claim 1, wherein colors of light emitted by the plurality of miniature light emitting diodes are the same.

4. The miniature light emitting diode chip according to claim 3, wherein at least one miniature light emitting diode comprises a light conversion layer arranged on the first side of the substrate, and the light conversion layer is configured to convert light in a first wavelength range into light in a second wavelength range, wherein the first wavelength range is different from the second wavelength range.

5. The miniature light emitting diode chip according to claim 1, wherein the miniature light emitting diode chip further comprises a spacer arranged in the spacing between any two of the plurality of miniature light emitting diodes.

6. A display substrate, comprising:
a base substrate; and
a miniature light emitting diode chip arranged on the base substrate,
wherein the miniature light emitting diode chip is the miniature light emitting diode chip according to claim 1, the second side of the substrate faces the base substrate, and the first side of the substrate is away from the base substrate;
wherein a driving circuit is arranged on the base substrate and on the second side of the substrate of the miniature light emitting diode chip, wherein the first terminal, the second terminal and the third terminal of the miniature light emitting diode chip are respectively electrically connected to the driving circuit;
wherein the first voltage signal is a power supply voltage signal, the second voltage signal is a reference voltage signal, and the third terminal is configured to receive a data signal; and
wherein the driving circuit comprises a first transistor, a second transistor, and a capacitor, a first terminal of the first transistor is connected to the third terminal, a control terminal of the first transistor is connected to a gate driving signal terminal, and a second terminal of the first transistor is connected to a control terminal of the second transistor; a first terminal of the second transistor is connected to the first terminal, a second terminal of the second transistor is connected to the first electrode of the miniature light emitting diode, the second electrode of the light-emitting diode is connected to the second terminal, and the capacitor is connected between the second terminal of the first transistor and the second terminal of the second transistor; and the test terminal is connected to the miniature light emitting diode in the miniature light emitting diode chip.

7. A display device, comprising the display substrate according to claim 6.

8. The display substrate according to claim 6, wherein the miniature light emitting diode is a Micro LED, and a size level of the substrate of the miniature light emitting diode chip is identical to a size level of a mini LED.

9. The display substrate according to claim 6, wherein the fourth terminal is configured to receive a test signal.

10. The display substrate according to claim 6, wherein the miniature light emitting diode chip comprises two test terminals arranged on the first side of the substrate, wherein the two test terminals are connected to the first electrode of the miniature light emitting diode and the second electrode of the miniature light emitting diode respectively, in order to apply the test signal to the miniature light emitting diode.

11. A method for manufacturing a display substrate, comprising:
providing a substrate, wherein the substrate comprises a first side and a second side that are disposed opposite to each other;
forming a first contact portion, a plurality of second contact portions, and a test terminal on the first side of the substrate;
forming a first terminal, a second terminal, a third terminal and a fourth terminal on the second side of the substrate; and
transferring a plurality of miniature light emitting diodes to the substrate through a first transfer process, so that the plurality of miniature light emitting diodes are located on a side of the first contact portion and the second contact portion away from the substrate, wherein each of the miniature light emitting diodes comprises a first electrode and a second electrode,
wherein the plurality of miniature light emitting diodes are spaced from each other, and an orthographic projection of a combination of the plurality of miniature light emitting diodes and a spacing between any two of the plurality of miniature light emitting diodes falls within the substrate;
wherein the first electrode of each of the plurality of miniature light emitting diodes is electrically connected to the first contact portion, and the second electrode of each of the plurality of miniature light emitting diodes is electrically connected to the plurality of second contact portions, respectively;
wherein an orthographic projection of at least one of the second terminal or the fourth terminal on the substrate at least partially overlaps with an orthographic projection of the test terminal on the substrate;
wherein an orthographic projection of the first contact portion on the substrate is spaced apart from an orthographic projection of each of the first terminal, the second terminal, the third terminal and the fourth terminal on the substrate, and an orthographic projection of the second contact portion on the substrate is spaced apart from an orthographic projection of each of the first terminal, the second terminal, the third terminal and the fourth terminal on the substrate; and
wherein the orthographic projection of each of the first contact portion and the second contact portion on the substrate is spaced apart from an orthographic projection of the test terminal on the substrate.

12. The method according to claim 11, further comprising:
transferring a miniature light emitting diode chip carrying the plurality of miniature light emitting diodes to a base substrate through a second transfer process,
wherein an accuracy of the second transfer process is less than an accuracy of the first transfer process.

13. The method according to claim 12, further comprising:
accessing a test signal via the test terminal to perform a light emitting test on the miniature light emitting diode chip carrying the plurality of miniature light emitting diodes.

* * * * *

UNITED STATES PATENT AND TRADEMARK OFFICE
CERTIFICATE OF CORRECTION

| | | |
|---|---|---|
| PATENT NO. | : 12,284,855 B2 | Page 1 of 1 |
| APPLICATION NO. | : 17/449058 | |
| DATED | : April 22, 2025 | |
| INVENTOR(S) | : Xaiwei Yun et al. | |

It is certified that error appears in the above-identified patent and that said Letters Patent is hereby corrected as shown below:

On the Title Page

Item (72) Inventors, Line 1:
Delete "Xaiwei Yun"
Insert --Xiawei Yun--

Signed and Sealed this
Twentieth Day of May, 2025

Coke Morgan Stewart
*Acting Director of the United States Patent and Trademark Office*